(12) United States Patent
Yano et al.

(10) Patent No.: US 8,373,950 B2
(45) Date of Patent: Feb. 12, 2013

(54) GROUND FAULT DETECTING SYSTEM AND ELECTRIC VEHICLE WITH GROUND FAULT DETECTING SYSTEM

(75) Inventors: Mitsuteru Yano, Tochigi-ken (JP); Toshiaki Takeshita, Haga-gun (JP); Yoshihiro Kawamura, Makinohara (JP)

(73) Assignees: Honda Motor Co., Ltd., Tokyo (JP); Yazaki Corporation, Tokyo (JP)

( * ) Notice: Subject to any disclaimer, the term of this patent is extended or adjusted under 35 U.S.C. 154(b) by 329 days.

(21) Appl. No.: 12/751,255

(22) Filed: Mar. 31, 2010

(65) Prior Publication Data
US 2010/0246081 A1    Sep. 30, 2010

(30) Foreign Application Priority Data

Mar. 31, 2009    (JP) ................................. 2009-086744

(51) Int. Cl.
*H02H 3/00* (2006.01)

(52) U.S. Cl. ....................................................... 361/42

(58) Field of Classification Search ...................... 361/42
See application file for complete search history.

(56) References Cited

U.S. PATENT DOCUMENTS

| | | | | |
|---|---|---|---|---|
| 6,919,726 B2 * | 7/2005 | Yudahira | ....................... | 324/522 |
| 6,984,988 B2 * | 1/2006 | Yamamoto | .................... | 324/509 |
| 6,992,490 B2 | 1/2006 | Nomoto et al. | | |
| 7,443,643 B2 * | 10/2008 | Kubo | ............................. | 361/42 |
| 7,714,587 B2 * | 5/2010 | Lindsey et al. | ............... | 324/509 |

FOREIGN PATENT DOCUMENTS

| | | |
|---|---|---|
| JP | 8-226950 | 9/1996 |
| JP | 2004-325381 | 11/2004 |
| WO | 2008/061357 A1 | 5/2008 |

OTHER PUBLICATIONS

European Office Action for Application No. 10158313.6, dated Jun. 7, 2010.
Japanese Office Action for Application No. 2009-086744, 3 pages, dated Dec. 4, 2012.

* cited by examiner

*Primary Examiner* — Stephen W Jackson
(74) *Attorney, Agent, or Firm* — Nelson Mullins Riley & Scarborough LLP; Anthony A. Laurentano

(57) ABSTRACT

When a malfunction of an ungrounded drive electric system including first and second ungrounded power supplies, an inverter, and a motor which is energized by the first and second ungrounded power supplies through the inverter, i.e., an erroneous opening of switches of a battery, is detected, switches of an insulation resistance detector are opened to insolate the insulation resistance detector from the ungrounded drive electric system.

7 Claims, 13 Drawing Sheets

I : POWER SUPPLY VOLTAGE MEASUREMENT PERIOD
II : CAPACITOR VOLTAGE READING AND DISCHARGIN PERIOD
III: POSITIVE-SIDE GROUND FAULT MEASURING PERIOD
IV : CAPACITOR VOLTAGE READING AND DISCHARGING PERIOD

GROUND FAULT DETECTING SYSTEM AND ELECTRIC VEHICLE WITH GROUND FAULT DETECTING SYSTEM

CROSS-REFERENCE TO RELATED APPLICATION

This application is based upon and claims the benefit of priority from Japanese Patent Application No. 2009-086744 filed on Mar. 31, 2009, of which the contents are incorporated herein by reference.

BACKGROUND OF THE INVENTION

1. Field of the Invention

The present invention relates to a ground fault detecting system for detecting a ground fault or an insulated state of an ungrounded power supply with respect to a grounded region (ground), and an electric vehicle incorporating such a ground fault detecting system.

2. Description of the Related Art

Generally, electric vehicles carry a power supply having a high voltage, which is of 200 [V] or higher, for example, insulated from the vehicle body as an ungrounded power supply.

There has been proposed a technology for detecting a ground fault (including a ground leakage or a lowered insulation resistance value due to a deteriorated insulation) of such a high-voltage ungrounded power supply (see, for example, Japanese Laid-Open Patent Publication No. 08-226950).

According to the technology disclosed in Japanese Laid-Open Patent Publication No. 08-226950, a storage battery as an ungrounded power supply is electrically connected to a propulsive motor via a circuit breaker, and a ground fault detector is connected parallel to the motor.

On the electric vehicle disclosed in Japanese Laid-Open Patent Publication No. 08-226950, electric power (counter-electromotive force) regenerated by the motor is supplied to charge the storage battery. Therefore, the counterelectromotive force generated by the motor is kept essentially as high as the voltage across the storage battery.

If the circuit breaker operates to disconnect the storage battery from the motor while the motor is operating in a regenerative mode, then a high regenerative voltage (counterelectromotive force) from the motor is applied to the ground fault detector, tending to break or damage circuit components of the ground fault detector.

SUMMARY OF THE INVENTION

It is an object of the present invention to provide a ground fault detecting system which is capable of preventing circuit components of a ground fault detector from being broken or damaged, and an electric vehicle incorporating such a ground fault detecting system.

According to the present invention, a ground fault detecting system detects a ground fault in an ungrounded drive electric system including an ungrounded power supply, a drive circuit, and a motor which is energized by the ungrounded power supply through the drive circuit.

The ground fault detecting system comprises a ground fault detector for measuring the resistance value of an insulation resistor of the ungrounded power supply with respect to a ground, the ground fault detector including switches connected between the ungrounded power supply and circuit components of the ground fault detector and between the ungrounded power supply and the ground, and a circuit breaking controller for opening the switches to isolate the ground fault detector from the ungrounded drive electric system when a malfunction or a shutdown of the ungrounded drive electric system is detected.

When a malfunction or a shutdown of the ungrounded drive electric system which includes the ungrounded power supply, the drive circuit, and the motor is detected, the switches of the ground fault detector are opened to isolate the ground fault detector from the ungrounded drive electric system. Consequently, circuit components of the ground fault detector are prevented from being damaged or broken.

The ungrounded power supply includes a first ungrounded power supply for generating a voltage and a second ungrounded power supply for generating a voltage lower than the voltage generated by the first ungrounded power supply. For example, the first ungrounded power supply comprises a fuel cell and the second ungrounded power supply comprises an electric energy storage. The ground fault detector is associated with the first ungrounded power supply, and the circuit breaking controller opens the switches when a failure which disconnects only the second ungrounded power supply from the ungrounded drive electric system is detected.

When a failure which disconnects only the second ungrounded power supply (electric energy storage) from the ungrounded drive electric system is detected, the switches of the ground fault detector are opened. Therefore, a high voltage generated due to an excessive counterelectromotive force of the motor which is in a regenerative mode is prevented from being applied to the ground fault detector.

The ground fault detector may be associated with the second ungrounded power supply.

According to the present invention, there is also provided an electric vehicle incorporating therein a ground fault detecting system which is constructed as described above.

As described above, according to the present invention, when a malfunction or a shutdown of the ungrounded drive electric system which includes the ungrounded power supply, the drive circuit, and the motor which is energized by the ungrounded power supply through the drive circuit is detected, the switches of the ground fault detector are opened to isolate the ground fault detector from the ungrounded drive electric system. Consequently, circuit components of the ground fault detector are prevented from being damaged or broken.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An electric vehicle incorporating a ground fault detecting system according to a preferred embodiment of the present invention will be described below with reference to the drawings.

Figure 1:
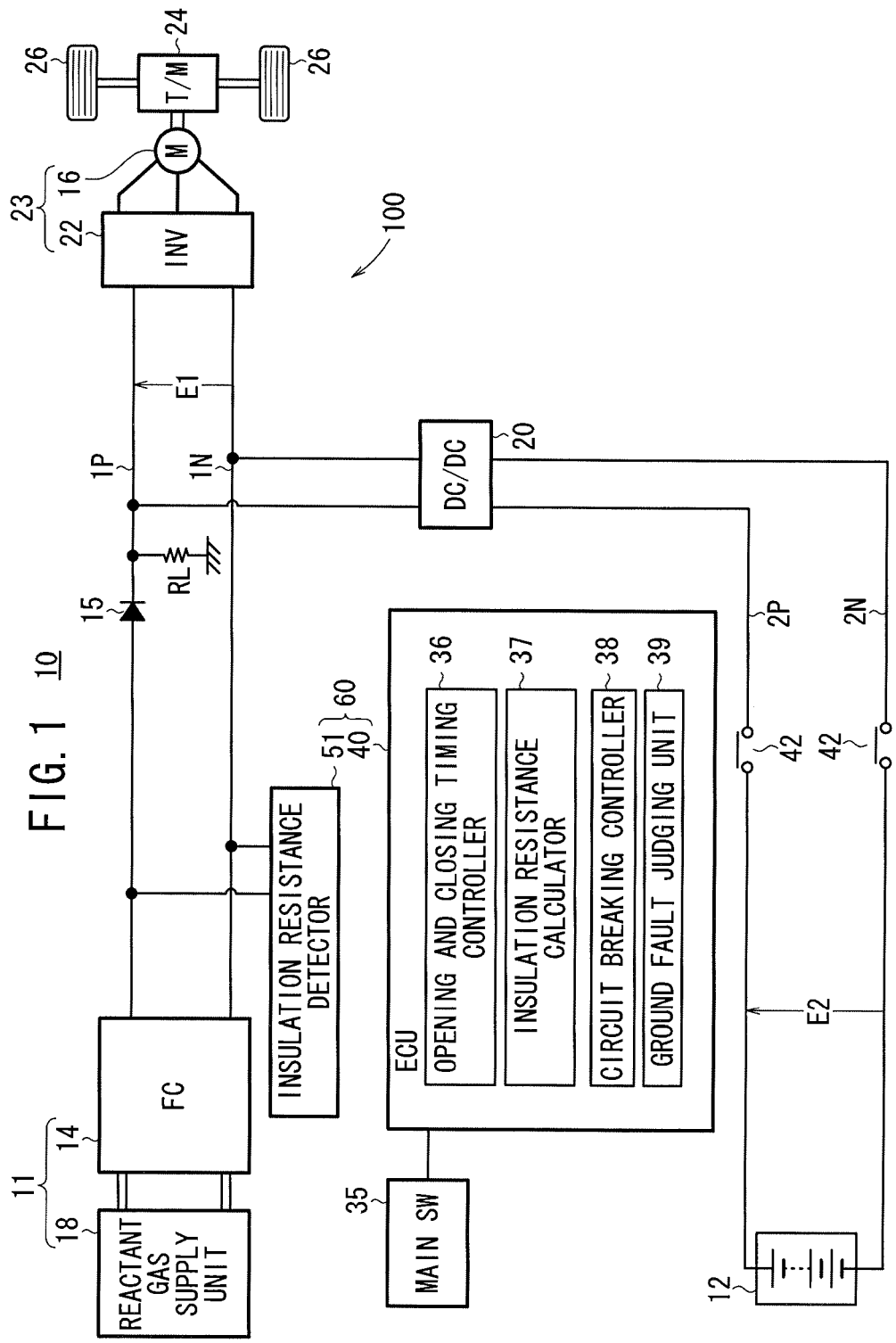
FIG. 1 is a block diagram of an electric vehicle incorporating a ground fault detecting system according to an embodiment of the present invention.

FIG. 1 shows in block form an electric vehicle 10 incorporating a ground fault detecting system according to an embodiment of the present invention.

As shown in FIG. 1, the electric vehicle 10 basically comprises a hybrid DC power supply apparatus including a fuel cell 14 (hereinafter also referred to as "first ungrounded power supply 14") which serves as a first ungrounded power supply (first DC power supply) for generating a voltage E1 between first main circuit lines 1P, 1N and a battery 12 (an electric energy storage, hereinafter also referred to as "second ungrounded power supply 12") which serves as a second ungrounded power supply (second DC power supply) for generating a voltage E2 (E1>E2) between second main circuit lines 2P, 2N, and a motor 16 as a load for propelling the electric vehicle 10, the motor 16 being supplied with electric power from the hybrid DC power supply apparatus through an inverter 22 (drive circuit).

The first and second ungrounded power supplies 14, 12, the inverter 22, and the motor 16 which is energized by the first and second ungrounded power supplies 14, 12 through the inverter 22 jointly make up an ungrounded drive electric system 100. A diode 15 for preventing an electric current from flowing into the fuel cell 14 is connected between the fuel cell 14 and the inverter 22.

The fuel cell 14 is of a stacked structure made up of a plurality of cells each comprising a solid polymer electrolyte membrane sandwiched between an anode and a cathode which are disposed one on each side of the solid polymer electrolyte membrane. The fuel cell 14 is connected to a reactant gas supply unit 18 by pipes. The reactant gas supply unit 18 includes a hydrogen tank (not shown) for storing hydrogen (a fuel gas) as a reactant gas and a compressor (not shown) for compressing air (an oxygen-containing gas) as another reactant gas. When the reactant gas supply unit 18 supplies the fuel cell 14 with hydrogen and air, these reactant gases cause an electrochemical reactant in the fuel cell 14, generating an electric current that is supplied to the motor 16 and the battery 12.

The fuel cell 14 and the reactant gas supply unit 18 jointly make up a fuel cell system 11 which includes an ECU (Electronic Control Unit) 40 for controlling the electric vehicle 10 as a whole, including the fuel cell 14 and the reactant gas supply unit 18.

The ECU 40 comprises a microcomputer or the like having a CPU (Central Processing Unit), a ROM (Read Only Memory, including an EEPROM), a RAM (Random Access Memory), input/output devices including an A/D converter and a D/A converter, a timer as a time measuring means, etc. When the CPU reads and executes programs stored in the ROM, it realizes various functions such as a control section, an arithmetic section, a processing section, etc. Specifically, the ECU 40 functions as an opening and closing timing controller 36, an insulation resistance calculator 37, a circuit breaking controller 38, and a ground fault judging unit 39, etc.

A DC/DC converter 20 comprises a chopper-type voltage converter having a set of terminals connected to the battery 12 through the second main circuit lines 2P, 2N and switches 42 and another set of terminals connected to the fuel cell 14 and the motor 16 through the first main circuit lines 1P, 1N.

Figure 2:
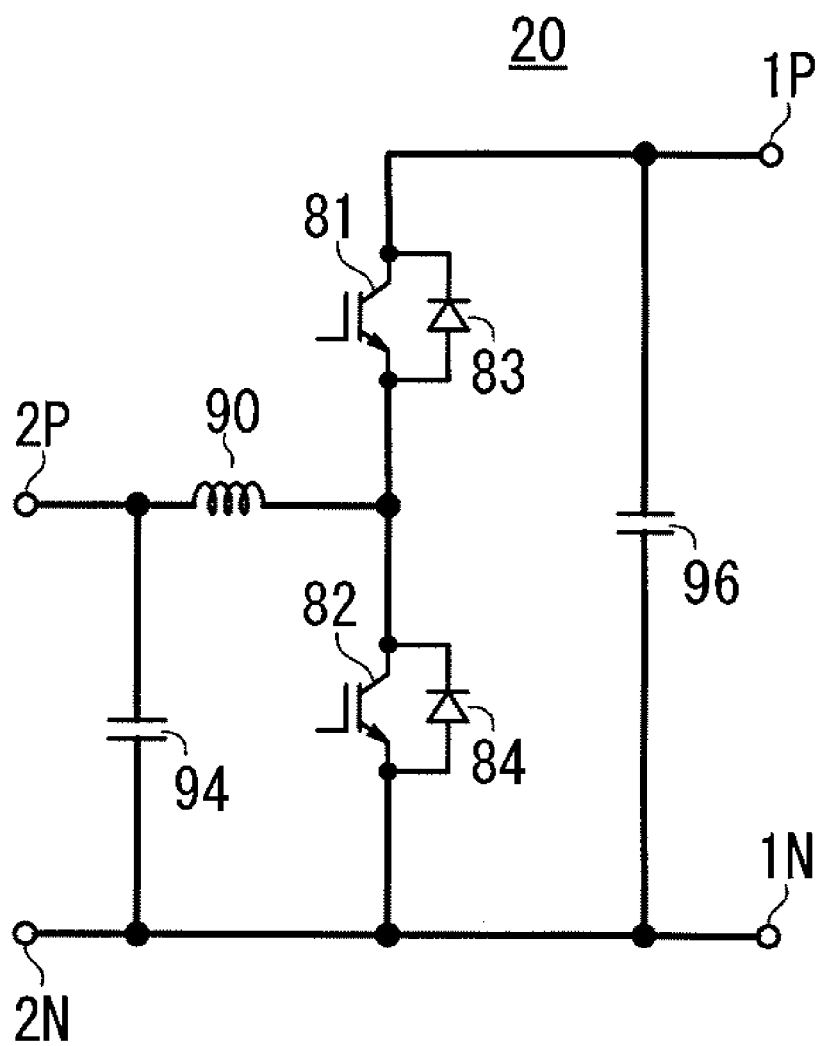
FIG. 2 is a circuit diagram of a DC/DC converter of the electric vehicle.

FIG. 2 is a circuit diagram of the DC/DC converter 20.

As shown in FIG. 2, the DC/DC converter 20 serves as a buck-boost converter for converting (increasing) the voltage E2 of the battery 12 to the voltage E1 (E2<E1) of the fuel cell 14 and converting (reducing) the voltage E1 of the fuel cell 14 to the voltage E2 of the battery 12.

The DC/DC converter 20 comprises a phase arm energizable by the ECU 40 and a reactor 90.

The phase arm comprises upper arm elements (an upper arm switching element 81 and a diode 83) and lower arm elements (a lower arm switching element 82 and a diode 84).

The upper arm switching element 81 and the lower arm switching element 82 comprise MOSFETs, IGBTs, or the like, respectively, for example.

The reactor 90 is inserted between a midpoint (common junction) of the phase arm and the positive terminal of the battery 12. The reactor 90 discharges and stores energy when the DC/DC converter 20 converts between the voltage E2 and the voltage E1.

Smoothing capacitors 94, 96 are connected between the second main circuit lines 2P, 2N and the first main circuit lines 1P, 1N, respectively.

The upper and lower arm switching elements 81, 82 are selectively turned on and off by the levels of gate drive signals (drive voltages) that are supplied from the ECU 40.

Figure 3:
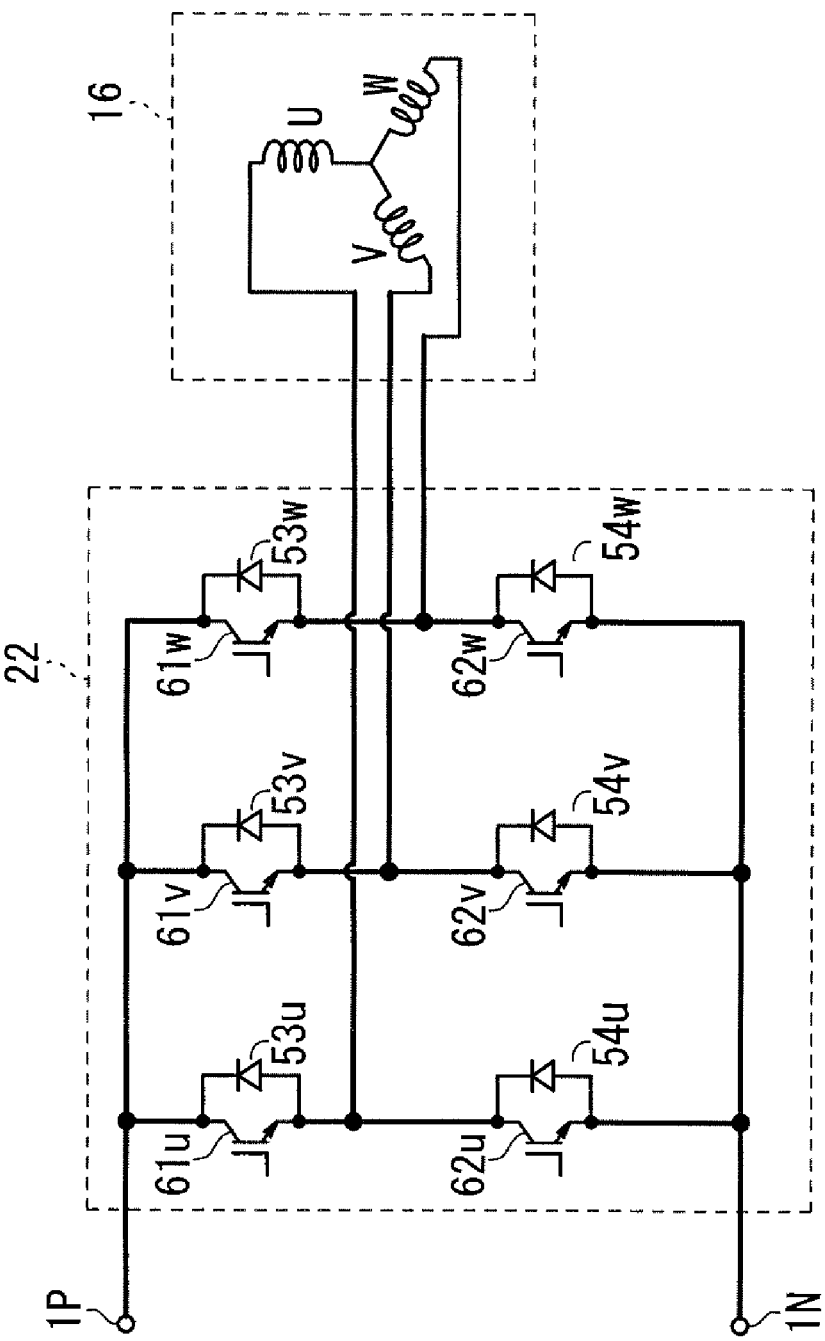
FIG. 3 is a circuit diagram of an inverter of the electric vehicle.

FIG. 3 is a circuit diagram of the inverter 22. As shown in FIG. 3, the inverter 22, which is of a three-phase full-bridge configuration, performs AC/DC conversions. Specifically, the inverter 22 converts a DC from the hybrid DC power supply apparatus to a three-phase AC and supplies the three-phase AC to the U-phase coil, V-phase coil, and W-phase coil of the motor 16, and also converts a three-phase AC generated by the motor 16 in a regenerative mode to a DC and supplies the DC from the first main circuit lines 1P, 1N through the DC/DC converter 20 to the second main circuit lines 2P, 2N, charging the battery 12.

The inverter 22 comprises switching elements 61u, 61v, 61w, 62u, 62v, 62w, which comprise MOSFETs, IGBTs, or the like, respectively, energizable by the ECU 40, and diodes 53u, 53v, 53w, 54u, 54v, 54w reverse-connected across the switching elements 61u, 61v, 61w, 62u, 62v, 62w, respectively.

As shown in FIG. 1, when energized, the motor 16 causes a transmission 24 to rotate wheels 26 of the electric vehicle 10. The inverter 22 and the motor 16 will collectively be referred to as a load 23.

The high-voltage battery 12 which is connected between the second main circuit lines 2P, 2N through the switches 42 is a high-voltage battery serving as an electric energy storage which may comprise a lithium ion secondary cell, a capacitor, or the like. In the present embodiment, the battery 12 comprises a lithium ion secondary cell.

The ECU 40 comprises a microcomputer or the like for generally controlling the electric vehicle 10 in its entirety including the fuel cell system 11, the switches 42, the DC/DC converter 20, the load 23, and an insulation resistance detector 51 to be described later. A main switch (power supply switch) 35 is connected to the ECU 40. The main switch 35 serves as an ignition switch for turning on (activating or starting) and turning off (deactivating) the electric vehicle 10 and the fuel cell system 11.

The insulation resistance detector (ground fault detector) 51 for detecting a ground fault of the fuel cell 14, the inverter 22, and the motor 16 that are connected to the first main circuit lines 1P, 1N based on the value of an insulation resistor RL which is shown as being connected between the first main circuit lines 1P, 1N.

The ECU 40 has a ground fault judging unit 39 (comparing unit) as a functional means. The insulation resistance detector 51 and the ECU 40 with the ground fault judging unit 39 make up a ground fault detecting system 60.

Figure 4:
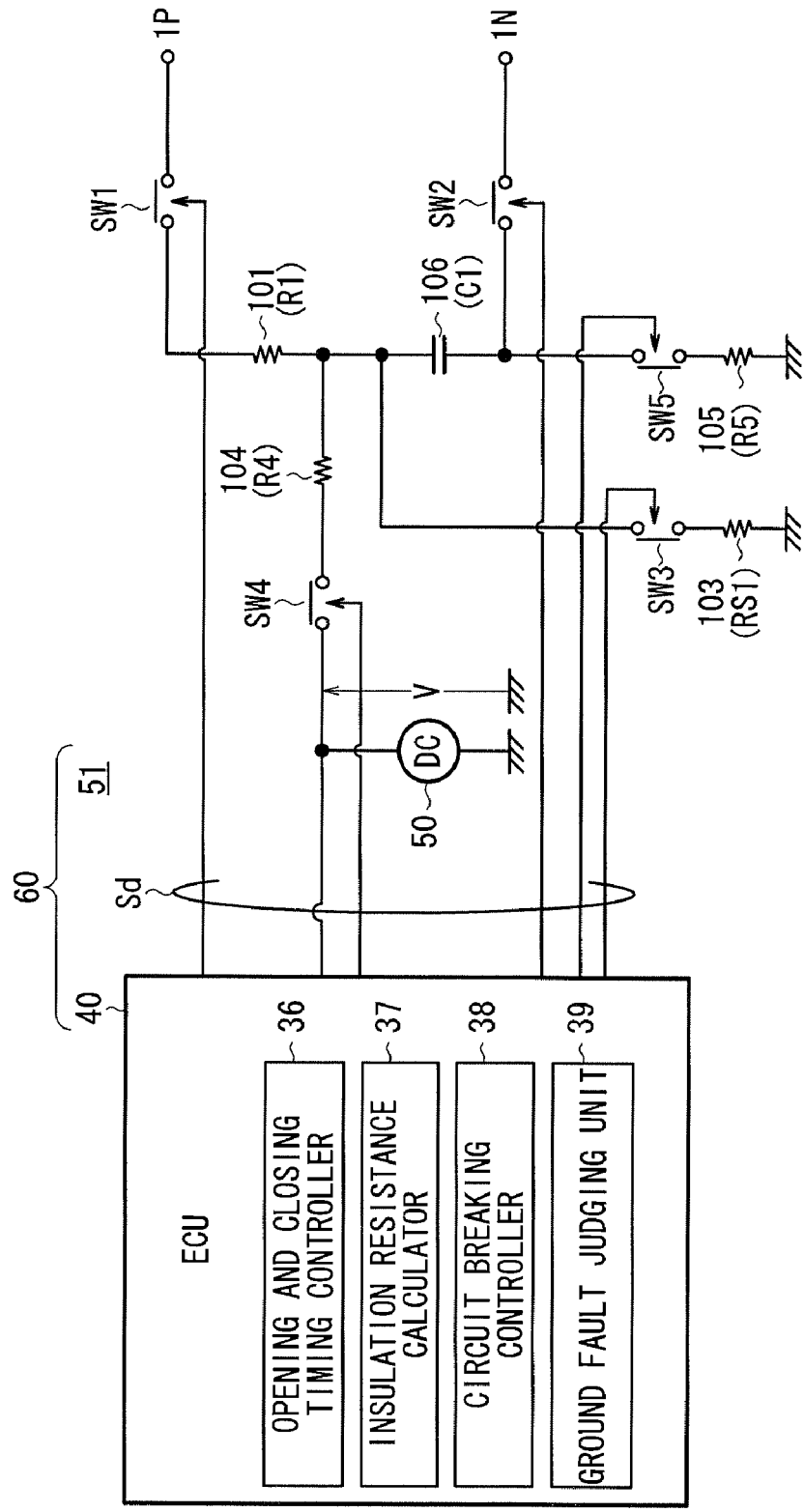
FIG. 4 is a circuit diagram of an insulation resistance detector of the ground fault detecting system.

FIG. 4 is a circuit diagram of the insulation resistance detector 51.

As shown in FIG. 4, a switch SW1 and a switch SW2 have respective ends connected to the first main circuit lines 1P, 1N, respectively. The switch SW1 has another end connected to an end of a resistor 101 having a resistance value (resistance) R1. The resistor 101 has another end connected to an end of a resistor 104 having a resistance value R4, an end of a switch SW3, and an end of a capacitor 106 having a capacitance C1.

The resistor 104 has another end connected through a switch SW4 to a voltage sensor (voltmeter) 50 which measures a voltage value (voltage) V between itself and a ground (vehicle body, vehicle ground). The detected voltage value V is read by the ECU 40 and stored in a memory of the ECU 40. The switch SW3 has another end connected to the ground through a resistor 103 having a resistance value RS1.

The capacitor 106 has another end connected to another end of the switch SW2 and also connected to the ground through a switch SW5 and a resistor 105 having a resistance value R5.

The switches SW1 through SW5 are opened and closed at times controlled by operation signals Sd from the ECU 40 (opening and closing timing controller 36 of the switches).

The ground fault detecting system 60 incorporated in the electric vehicle 10 is basically constructed as described above. Operation of the ground fault detecting system 60 for detecting a ground fault in the electric vehicle 10 will be described below.

Figure 5:
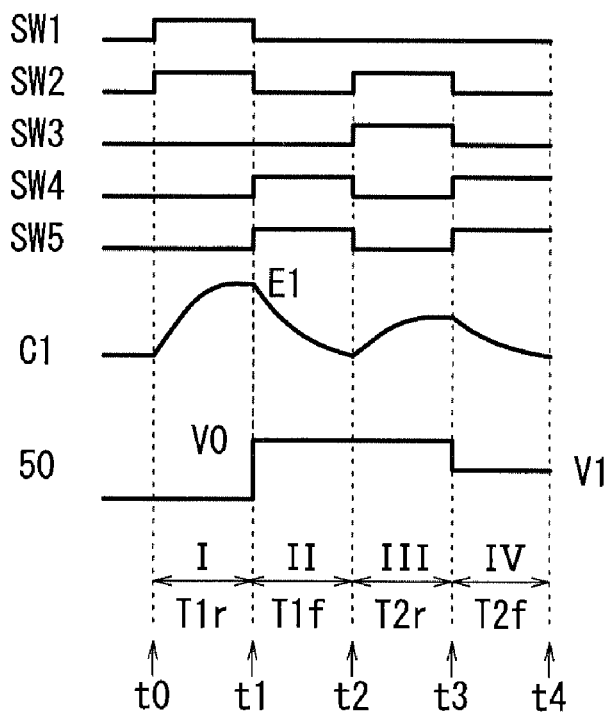
FIG. 5 is a timing chart illustrative of the principles of measurement of an insulation resistance value.
Figure 6:
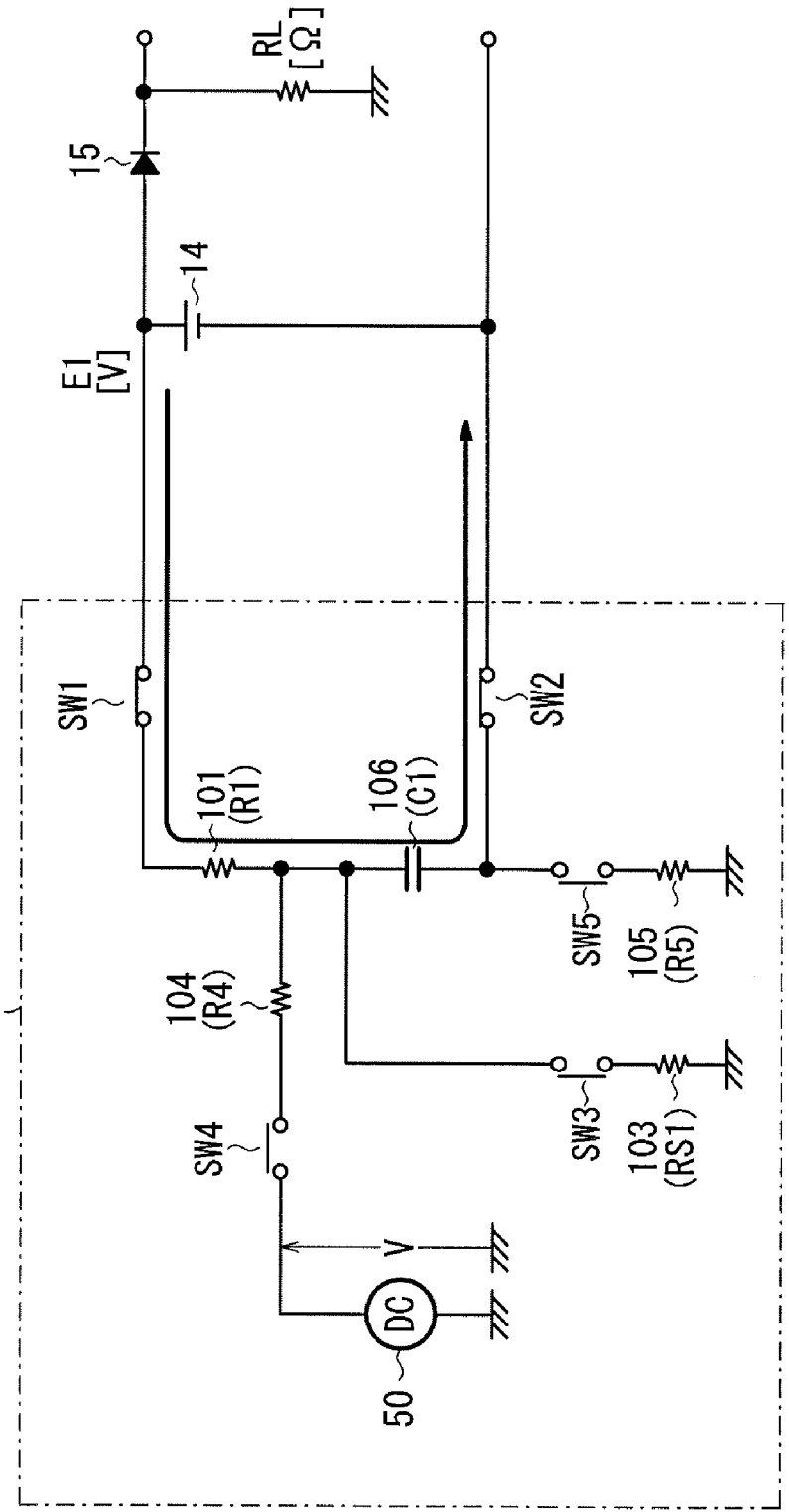
FIG. 6 is a circuit diagram of the insulation resistance detector, showing its operation in a power supply voltage measurement period (charging period)

FIG. 5 is a timing chart illustrative of the measurement of the insulation resistor RL whose resistance value is also referred to as RL [Ω] (see FIG. 6). In a first rise time (first given time) T1$r$ from time t0 to time t1, which is referred to as "I: POWER SUPPLY VOLTAGE MEASUREMENT PERIOD", the switches SW1, SW2 are closed as shown in FIG. 6, charging the capacitor 106 to a voltage V0 toward the voltage E1 [V] of the first ungrounded power supply 14 according to the following equation (1):

$$V0=E1[1-\exp\{-(T1r/(R1\times C1))\}]  \quad (1)$$

Figure 7:
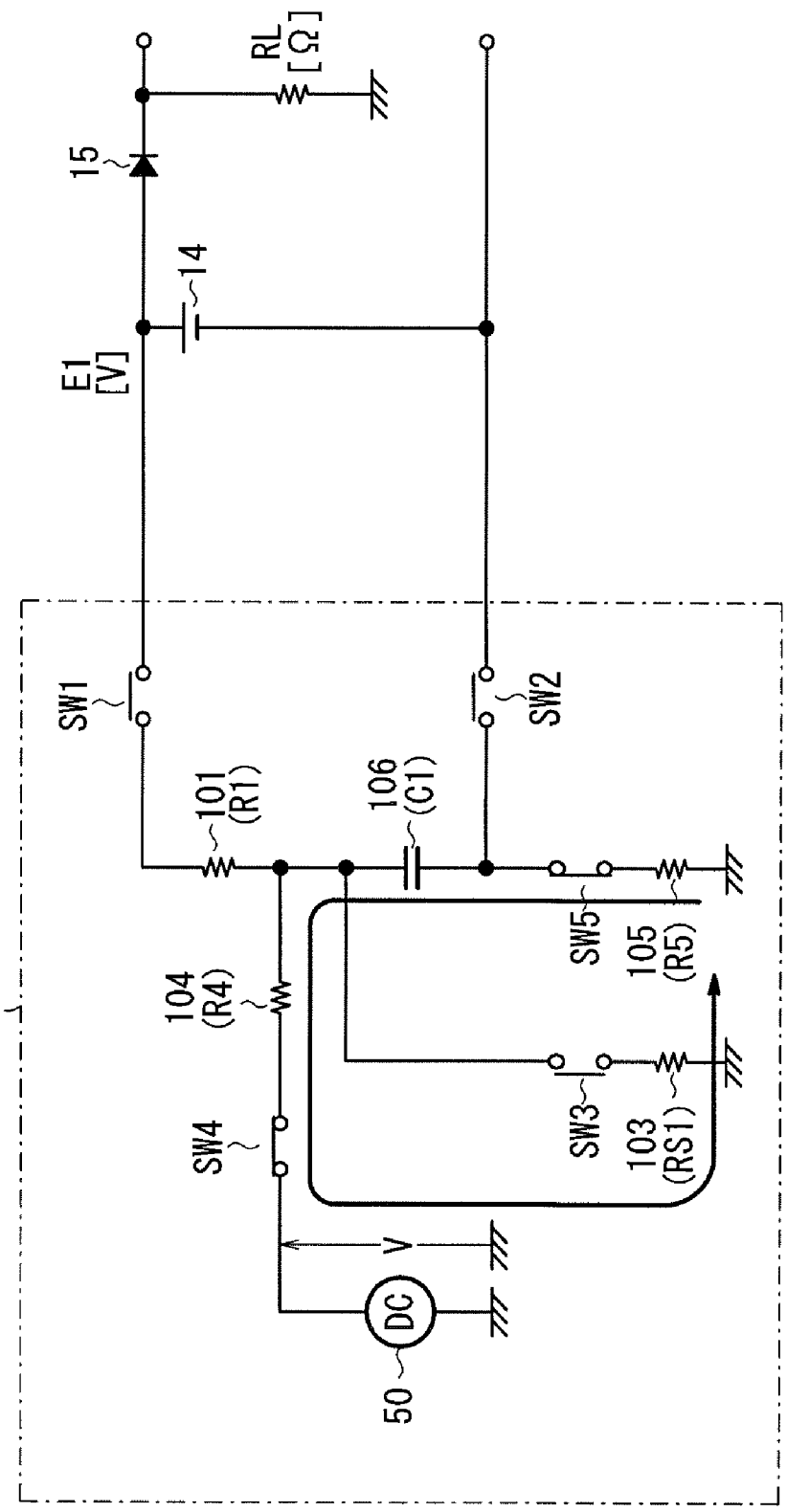
FIG. 7 is a circuit diagram of the insulation resistance detector, showing its operation in a capacitor voltage reading and discharging period.

At time t1, the switches SW1, SW2 are opened and the switches SW4, SW5 are closed as shown in FIG. 7, allowing the voltage sensor 50 to measure the voltage V0 and store the voltage V0 in the memory of the ECU 40. The ECU 40 and the voltage sensor 50 operate as a peak hold circuit in a period T1$f$ from time t1 to time t2 which is referred to as "II: CAPACITOR VOLTAGE READING AND DISCHARGING PERIOD". The electric energy stored in the capacitor 106 is discharged through the internal resistance of the voltage sensor 50 along a path indicated by the arrow in FIG. 7.

From time t0 to time t2, the capacitor 106 is charged without being affected by the insulation resistor RL.

Figure 8:
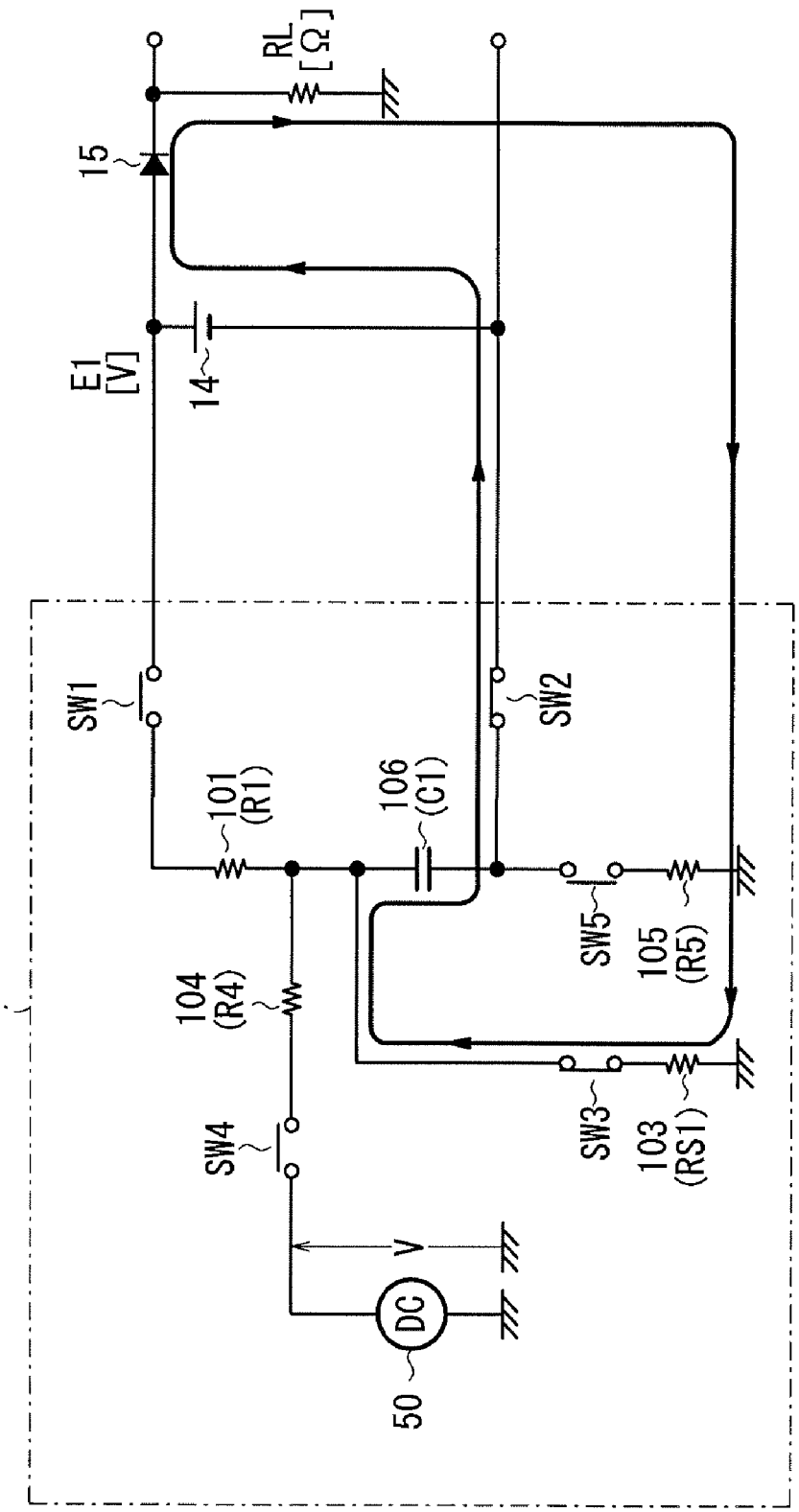
FIG. 8 is a circuit diagram of the insulation resistance detector, showing its operation in a positive-side ground fault measurement period (charging period)

In a second rise time (second given time) T2$r$ from time t2 to time t3, which is referred to as "III: POSITIVE-SIDE GROUND FAULT MEASURING PERIOD", the switches SW2, SW3 are closed as shown in FIG. 8. Now, an electric current flows from the positive terminal of the first ungrounded power supply 14 via the diode 15, the insulation resistor RL, the resistor 103, the switch SW3, the capacitor 106, and the switch SW2 to the negative terminal of the first ungrounded power supply 14, charging the capacitor 106 to a voltage V1 toward the voltage E1 [V] of the first ungrounded power supply 14 according to the following equation (2):

$$V1=E1[1-\exp\{-(T2r/((RL+RS1)\times C1))\}]  \quad (2)$$

From time t3 to time t4, the switches SW1, SW2 are opened and the switches SW4, SW5 are closed to provide the circuit shown in FIG. 7, allowing the voltage sensor 50 to measure the voltage V1 and store the voltage V1 in the memory of the ECU 40. The ECU 40 and the voltage sensor 50 operate as a peak hold circuit in a period from time t3 to time t4 which is referred to as "IV: CAPACITOR VOLTAGE READING AND DISCHARGING PERIOD". The capacitor 106 operates as a flying capacitor.

Figure 9:
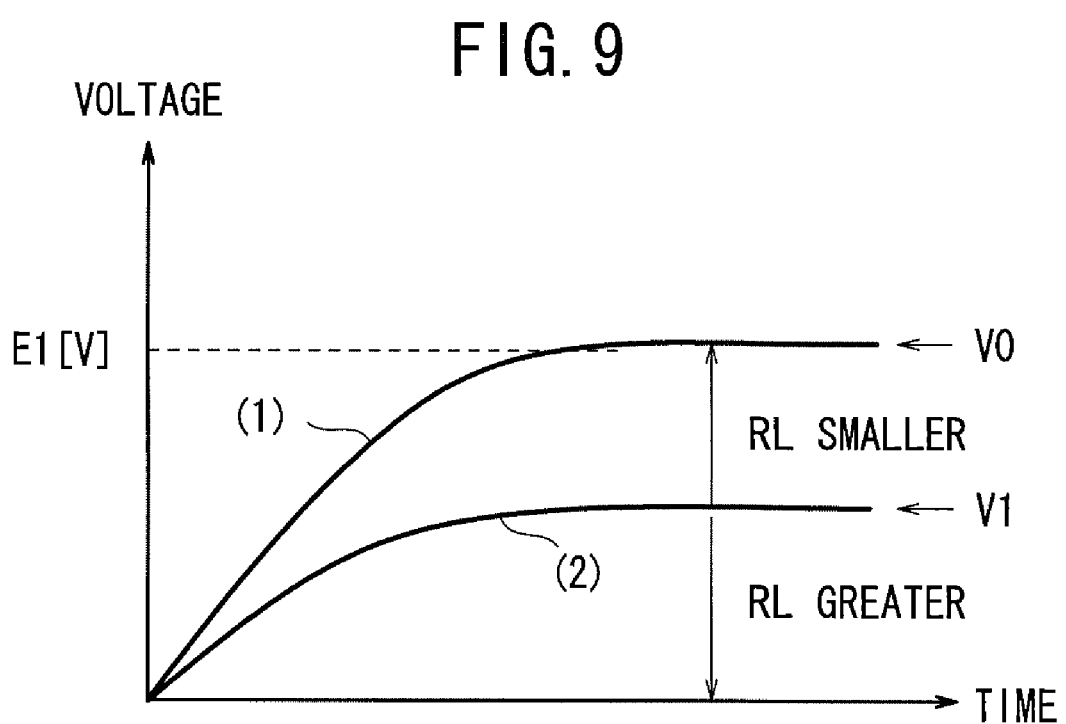
FIG. 9 is a graph showing how charged voltages change within a given period of time depending on the magnitude of an insulation resistance value.

FIG. 9 shows how charged voltages V0, V1 change within a given period of time depending on the magnitude of the insulation resistance value RL. As shown in FIG. 9, since a current limiting resistor is represented by RL+RS1 as indicated by the equation (2), as the insulation resistance value RL is greater, the time constant is greater, and the charged voltage V1 in the second given time T2$r$ is smaller. Conversely, the insulation resistance value RL is smaller, the charged voltage V1 in the second given time T2$r$ approaches the voltage (power supply voltage) E1 of the first ungrounded power supply 14.

Figure 10:
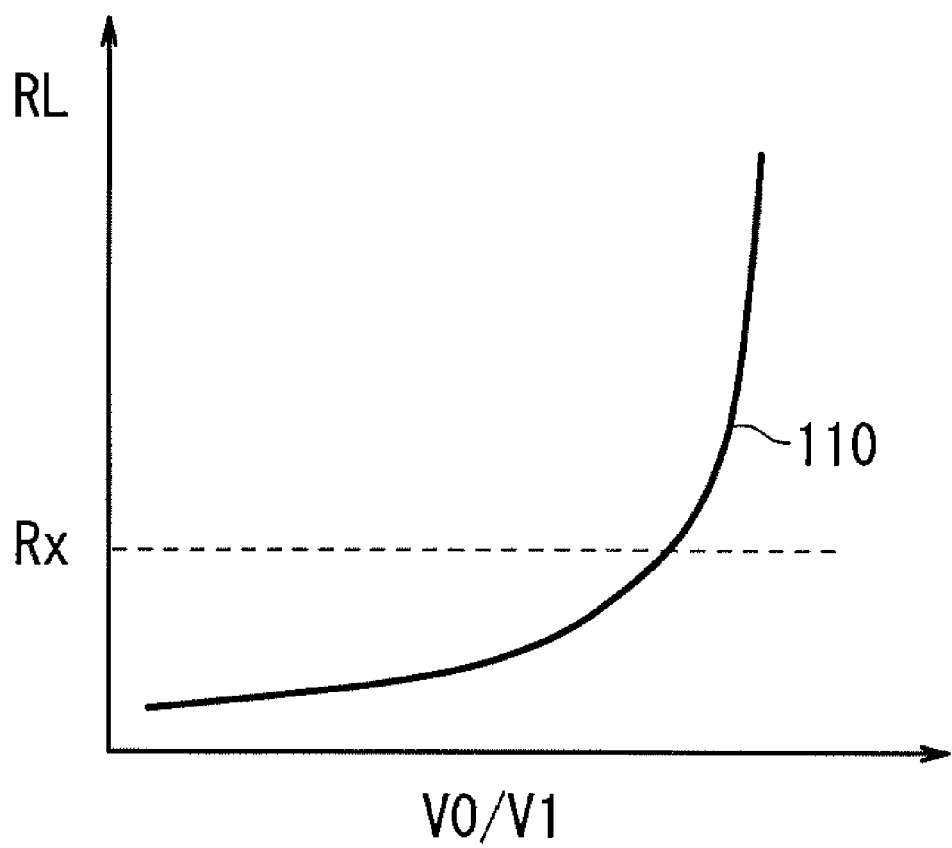
FIG. 10 is a graph showing the relationship between a voltage ratio and an insulation resistance value.

As indicated by a characteristic curve 110 shown in FIG. 10 which represents the relationship between a voltage ratio between the voltages V0, V1 (V0/V1) and the insulation resistance value RL, the insulation resistance value RL can be determined from the voltage ratio V0/V1. The ground fault judging unit 39 of the ECU 40 compares the measured insulation resistance value RL with a threshold value Rx [Ω]. If the insulation resistance value RL is greater than the abnormal detection threshold value Rx, then the ground fault judging unit 39 judges that no ground fault has occurred. If the insulation resistance value RL is smaller than the abnormal detection threshold value Rx, then the ground fault judging unit 39 judges that a ground fault has occurred, and issues an alarm.

Figure 11:
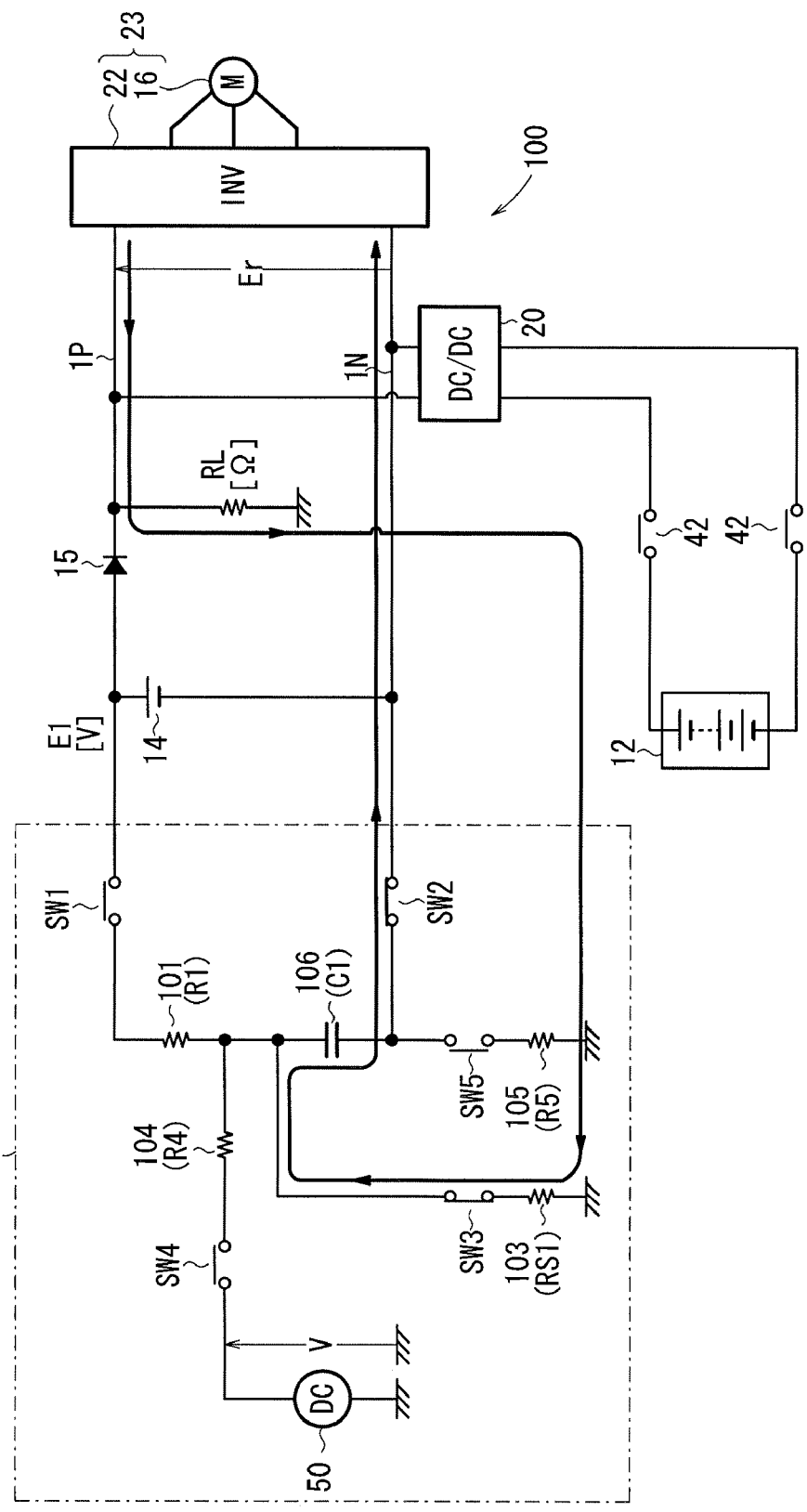
FIG. 11 is a circuit diagram illustrative of a problem which occurs when switches of a battery are erroneously opened while a motor is in a regenerative mode.

While the insulation resistance value RL (ground fault) is being detected, e.g., while an electric current is flowing through the insulation resistor RL along the path shown in FIG. 8 to charge the capacitor 106, in the event of a failure which erroneously opens the switches 42 of the battery 12 as shown in FIG. 11 when the motor 16 is in the regenerative mode, a regenerated electric current generated by the counterelectromotive force of the motor 16 is not supplied to charge the battery 12. Consequently, an excessive voltage Er due to the counterelectromotive force is applied between the first main circuit lines 1P, 1N.

Figure 12:
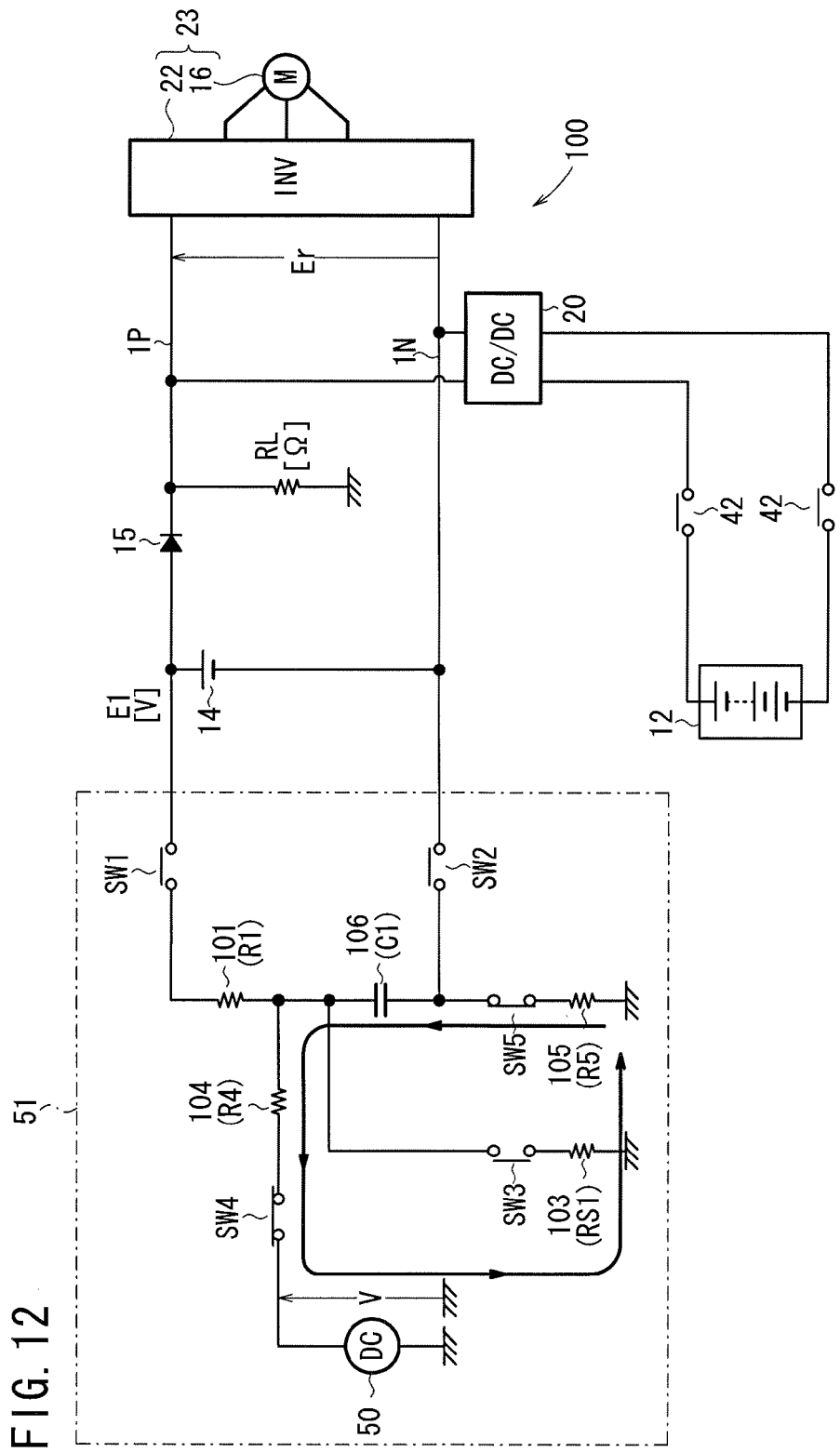
FIG. 12 is a circuit diagram illustrative of a problem which occurs when the switches of the battery are erroneously opened while the motor is in the regenerative mode.

The excessive voltage Er causes the capacitor 106 to be charged through a path indicated by the arrows in FIG. 11, i.e., a loop from the first main circuit line 1P through the insulation resistor RL, the resistor 103, the switch SW3, the capacitor 106, the switch SW2 to first main circuit line 1N. At this time, an excessive voltage (high voltage) is applied to the resistor 103 and the capacitor 106 which belong to the internal circuit of the insulation resistance detector 51. Furthermore, as shown in FIG. 12, when the voltage across the capacitor 106 which is charged under the excessive voltage is read by the voltage sensor 50, an excessive voltage (high voltage) tends to be applied to the resistor 105, the switch SW5, the resistor 104, the switch SW4, and the voltage sensor 50 along a path indicated by the arrows.

In other words, in the event of a failure which erroneously opens the switches 42 of the battery 12 when the motor 16 is in the regenerative mode, a high voltage is applied to components of the internal circuit of the insulation resistance detector 51. Therefore, those components may be damaged or need to be high-voltage components. High-voltage components are considerably large in volume and expensive because they have large creepage distances.

According to the present embodiment, when a malfunction or shutdown is detected in the ungrounded drive electric system 100 which comprises the first and second ungrounded power supplies 14, 12, the inverter 22, and the motor 16 which is energized by the first and second ungrounded power supplies 14, 12 through the inverter 22, the switches SW1 through SW5 of the insulation resistance detector 51 are opened to insolate the insulation resistance detector 51 from the ungrounded drive electric system 100.

Specifically, when a failure which erroneously opens the switches 42 is detected while the battery 12 is being charged by a regenerative electric current which is generated by the motor 16 operating in the regenerative mode, the operation signals Sd (see FIG. 4) are immediately turned into deactivation signals, opening all the switches SW1 through SW5 of the insulation resistance detector 51.

A failure which erroneously opens the switches 42 while the battery 12 is being charged by the regenerative electric current from the motor 16 can easily be detected by detecting, with the ECU 40, a change in the electric current flowing into the battery 12, a change in the voltage across the battery 12, or a change in the voltage between the first main circuit lines 1P, 1N.

Moreover, when the insulation resistance detector 51 itself malfunctions, or when the fuel cell system 11 fails to generate electric power and does not charge the capacitor 106 of the insulation resistance detector 51 though the battery 12 is connected to the DC/DC converter 20, the ECU 40 should preferably operate to regard the insulation resistance detector 51 as suffering a failure and deactivate the insulation resistance detector 51, i.e., opens the switches SW1 through SW5 of the insulation resistance detector 51.

Operation of the ECU 40 (circuit breaking controller 38) to deactivate the insulation resistance detector 51 while the motor 16 is in the regenerative mode and while the fuel cell 14 fails to generate electric power will be described below with reference to a flowchart shown in FIG. 13.

Figure 13:
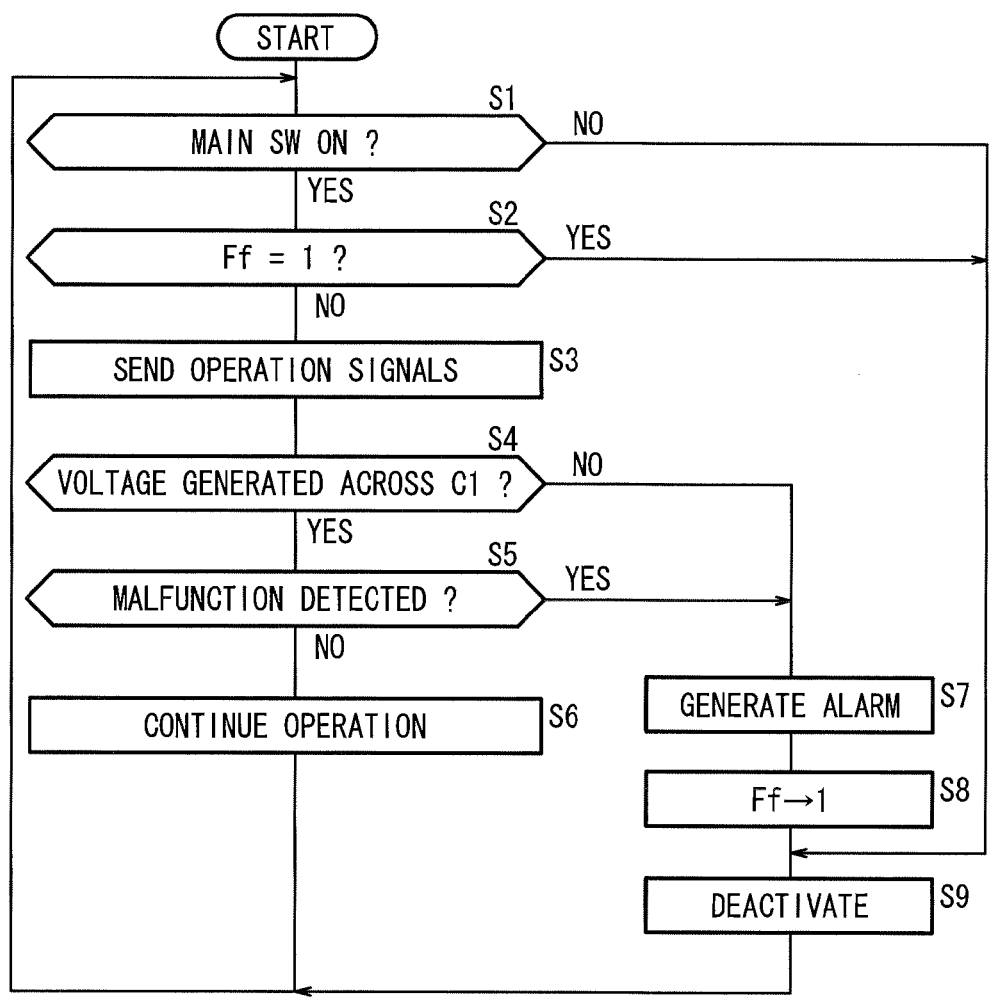
FIG. 13 is a flowchart of an operation sequence of the ground fault detecting system.

In step S1 shown in FIG. 13, the ECU 40 determines whether the main switch 35 is turned on or not. If the main switch 35 is turned on, then the ECU 40 determines whether a failure detecting flag Ff of the insulation resistance detector 51 is on (Ff=1) or not in step S2.

Since the failure detecting flag Ff is initially off (Ff=0), the ECU 40 starts to send the operation signals Sd to open and close the switches SW1 through SW5 for detecting the insulation resistance value RL according to the sequence shown in FIG. 5, in step S3.

In step S4, the voltage sensor 50 detects whether a charged voltage is generated across the capacitor 106 (C1) or not when the switches SW1, SW2 are closed, for example. If a charged voltage is generated across the capacitor 106, then since the insulation resistance detector 51 is normal, the ECU 40 determines whether the switches 42 of the battery 12 are erroneously open or not in step S5.

If the switches 42 of the battery 12 are not erroneously open (normal), then the ECU 40 continuously operates to detect the insulation resistance value RL. After the insulation resistance value RL is detected, i.e., after the sequence shown in FIG. 5 is finished, control goes back to step S1.

If the main switch 35 is turned off in step S1, then the ECU 40 deactivates the insulation resistance detector 51 in step S9.

If no charged voltage is generated across the capacitor 106 in step S4, then the ECU 40 judges that a failure has occurred opening the switches SW1 through SW5 or a failure has occurred causing the fuel cell 14 to fail to generate electric power. In step S7, the ECU 40 generates an alarm. In step S8, the ECU 40 turns on the failure detecting flag Ff. In step S9, the ECU 40 deactivates the insulation resistance detector 51.

If the switches 42 of the battery 12 are erroneously open in step S5, the ECU 40 opens all the switches SW1 through SW5 of the insulation resistance detector 51. Then, the ECU 40 generates an alarm in step S7, turns on the failure detecting flag Ff in step S8, and deactivates the insulation resistance detector 51 in step S9.

According to the present embodiment, as described above, when a malfunction of the ungrounded drive electric system 100 which includes the first and second ungrounded power supplies 14, 12, the inverter 22, and the motor 16 which is energized by the first and second ungrounded power supplies 14, 12 through the inverter 22, i.e., an erroneous opening of the switches 42 of the battery 12, or a failure of the fuel cell system 11 to generate electric power, is detected, the switches SW1 through SW5 of the insulation resistance detector 51 are opened to insolate the insulation resistance detector 51 from the ungrounded drive electric system 100.

Therefore, the components of the insulation resistance detector 51 are prevented from being damaged or broken. If the fuel cell system 11 fails to generate electric power, then the insulation resistance detector 51 does not perform its insulation resistance detecting process, and hence any useless process is prevented from being carried out.

More specifically, the ground fault detecting system 60 serves to detect a ground fault in the ungrounded drive electric system 100 which comprises the first and second ungrounded power supplies 14, 12, the inverter 22 as a drive circuit, and the motor 16 which is energized by the first and second ungrounded power supplies 14, 12 through the inverter 22. The ground fault detecting system 60 includes the ground fault detector 51 for measuring the insulation resistance RL of the first and second ungrounded power supplies 14, 12 with respect to the ground, the ground fault detector 51 having the switches SW1 through SW5 connected between the first and second ungrounded power supplies 14, 12 and the resistor 101 and the capacitor 106 which are components of the ground fault detector 51, and between the first and second ungrounded power supplies 14, 12 and the ground, and the circuit breaking controller 38 for opening the switches SW1 through SW5 to isolate the ground fault detector 51 from the ungrounded drive electric system 100 when a malfunction or a shutdown of the ungrounded drive electric system 100 is detected.

The first ungrounded power supply 14 generates the voltage E1, and the second ungrounded power supply 12 generates the voltage E2 which is lower than the voltage E1. The circuit breaking controller 38 should preferably open the switches SW1 through SW5 when a failure has occurred to disconnect only the second ungrounded power supply 12 from the ungrounded drive electric system 100.

The ground fault detector 51 includes the first and second switches SW1, SW2 having respective ends connected to the positive and negative terminals, respectively, of the first ungrounded power supply 14 and the second ungrounded power supply 12, the first resistor 101 having an end connected to another end of the first switch SW1, the capacitor 106 having an end connected to another end of the first resistor 101, the third switch SW3 having an end connected to the other end of the first resistor 101, the fourth switch SW4 having an end connected to the other end of the first resistor 101, the fifth switch SW5 having an end connected to a common junction between another end of the capacitor 106 and another end of the second switch SW2, the voltage sensor 50 connected between another end of the fourth switch SW4 and the ground, the second resistor 103 connected between another end of the third switch SW3 and the ground, and the third resistor 105 connected between another end of the fifth switch SW5 and the ground.

The insulation resistance calculator 37 is controlled by the opening and closing timing controller 36 to measure, with the voltage sensor 50, the first charged voltage V0 across the capacitor 106 when the first and second switches SW1, SW2 are closed for the first given time T1$r$ to charge the capacitor 106 from the state in which the first through fifth switches SW1 through SW5 are open, then opens the first through third switches SW1 through SW3 and closes the fourth and fifth switches SW4, SW5 to discharge the capacitor 106 for the time T1$f$, measures, with the voltage sensor 50, the second charged voltage V1 across the capacitor 106 when the first, fourth, and fifth switches SW1, SW4, SW5 are opened and the second and third switches SW2, SW3 are closed for the second given time T2$r$ to charge the capacitor 106, opens the first through fifth switches SW1 through SW5, and determines the resistance value of the insulation resistor RL based on the ratio V1/V0 of the first and second charged voltages V0, V1.

Although a certain preferred embodiment of the present invention has been shown and described in detail, it should be understood that various changes and modifications may be made therein without departing from the scope of the appended claims.

What is claimed is:

1. A ground fault detecting system for detecting a ground fault in an ungrounded drive electric system including an ungrounded power supply, a drive circuit, and a motor which is energized by the ungrounded power supply through the drive circuit, comprising:
    a ground fault detector for measuring a resistance value of an insulation resistor of the ungrounded power supply with respect to a ground;
    the ground fault detector including switches connected between the ungrounded power supply and circuit components of the ground fault detector and between the ungrounded power supply and the ground; and
    a circuit breaking controller for opening the switches to isolate the ground fault detector from the ungrounded drive electric system when a malfunction or a shutdown of the ungrounded drive electric system is detected.

2. A ground fault detecting system according to claim 1, wherein the ungrounded power supply includes a first ungrounded power supply for generating a voltage and a second ungrounded power supply for generating a voltage lower than the voltage generated by the first ungrounded power supply; and
    the circuit breaking controller opens the switches when a failure which disconnects only the second ungrounded power supply from the ungrounded drive electric system is detected.

3. An electric vehicle incorporating a ground fault detecting system, the ground fault detecting system detecting a ground fault in an ungrounded drive electric system including an ungrounded power supply, a drive circuit, and a motor which is energized by the ungrounded power supply through the drive circuit, the ground fault detecting system comprising:
    a ground fault detector for measuring a resistance value of an insulation resistor of the ungrounded power supply with respect to a ground;
    the ground fault detector including switches connected between the ungrounded power supply and circuit components of the ground fault detector and between the ungrounded power supply and the ground; and
    a circuit breaking controller for opening the switches to isolate the ground fault detector from the ungrounded drive electric system when a malfunction or a shutdown of the ungrounded drive electric system is detected.

4. A ground fault detecting system according to claim 1, wherein the switches include a first switch, a second switch, a third switch, a fourth switch, and a fifth switch;
    the circuit components include a first resistor and a capacitor; and
    the ground fault detector includes:
    the first switch and the second switch which have respective ends connected to positive and negative terminals, respectively, of the ungrounded power supply;
    the first resistor having an end connected to another end of the first switch;
    the capacitor having an end connected to another end of the first resistor;
    the third switch having an end connected to the other end of the first resistor;
    the fourth switch having an end connected to the other end of the first resistor;
    the fifth switch having an end connected to a common junction between another end of the capacitor and another end of the second switch;
    a voltage sensor connected between another end of the fourth switch and the ground;
    a second resistor connected between another end of the third switch and the ground; and
    a third resistor connected between another end of the fifth switch and the ground.

5. A ground fault detecting system according to claim 4, further comprising an opening and closing timing controller for controlling times at which the first switch, the second switch, the third switch, the fourth switch, and the fifth switch are opened and closed.

6. A ground fault detecting system according to claim 5, further comprising an insulation resistance calculator to be controlled by the opening and closing timing controller for measuring, with the voltage sensor, a first charged voltage across the capacitor when the first and second switches are closed for a first given time to charge the capacitor from a state in which the first through fifth switches are open, then opening the first through third switches and closing the fourth and fifth switches to discharge the capacitor for a time, measuring, with the voltage sensor, a second charged voltage across the capacitor when the first, fourth, and fifth switches are opened and the second and third switches are closed for a second given time to charge the capacitor through the insulation resistor and the second resistor, opening the first through fifth switches, and determining the resistance value of the insulation resistor based on a ratio of the first and second charged voltages.

7. A ground fault detecting system according to claim 2, wherein the first ungrounded power supply comprises a fuel cell and the second ungrounded power supply comprises an electric energy storage.

* * * * *